(12) United States Patent
Chen et al.

(10) Patent No.: US 9,853,148 B2
(45) Date of Patent: Dec. 26, 2017

(54) POWER MOSFETS AND METHODS FOR MANUFACTURING THE SAME

(71) Applicant: TAIWAN SEMICONDUCTOR MANUFACTURING COMPANY LTD., Hsinchu (TW)

(72) Inventors: Shiang-Yu Chen, Hsinchu (TW); Kuo-Ming Wu, Hsinchu (TW); Yi-Chun Lin, Hsinchu (TW); Alexander Kalnitsky, San Francisco, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/013,747

(22) Filed: Feb. 2, 2016

(65) Prior Publication Data

US 2017/0222050 A1    Aug. 3, 2017

(51) Int. Cl.
| | |
|---|---|
| H01L 29/78 | (2006.01) |
| H01L 29/66 | (2006.01) |
| H01L 29/26 | (2006.01) |
| H01L 21/265 | (2006.01) |
| H01L 21/324 | (2006.01) |

(52) U.S. Cl.
CPC .... *H01L 29/7835* (2013.01); *H01L 21/26513* (2013.01); *H01L 21/324* (2013.01); *H01L 29/26* (2013.01); *H01L 29/6656* (2013.01); *H01L 29/6659* (2013.01); *H01L 29/7836* (2013.01)

(58) Field of Classification Search
CPC ............... H01L 29/7835; H01L 21/324; H01L 21/26513; H01L 29/26; H01L 29/6659; H01L 29/7836; H01L 29/6656
See application file for complete search history.

(56) References Cited

U.S. PATENT DOCUMENTS

| | | | | |
|---|---|---|---|---|
| 5,041,885 A | * | 8/1991 | Gualandris | ....... H01L 21/82381 257/288 |
| 5,290,720 A | * | 3/1994 | Chen | ............... H01L 21/823835 257/328 |
| 5,780,341 A | * | 7/1998 | Ogura | ............... H01L 21/28273 257/E21.209 |

(Continued)

OTHER PUBLICATIONS

Office action from the Taiwan patent office for counterpart application 105140723 dated Nov. 9, 2017.

*Primary Examiner* — Jarrett Stark
(74) *Attorney, Agent, or Firm* — WPAT, P.C., Intellectual Property Attorneys; Anthony King (57) ABSTRACT

A semiconductor device and the method of manufacturing the same are provided. The semiconductor device comprises a well region, a first doped region, a drain region, a source region and a gate electrode. The first doped region of a first conductivity type is located at a first side within the well region. The drain region of the first conductivity type is within the first doped region. The source region of the first conductivity type is at a second side within the well region, wherein the second side being opposite to the first side. The gate electrode is over the well region and between the source region and the drain region. A surface of the drain region and a surface of the source region define a channel and the surface of the source region directly contacts the well region.

20 Claims, 6 Drawing Sheets

(56) References Cited

U.S. PATENT DOCUMENTS

| | | | |
|---|---|---|---|
| 6,300,656 B1* | 10/2001 | Ueno | H01L 21/26586 257/314 |
| 6,583,013 B1* | 6/2003 | Rodder | H01L 21/823857 257/E21.634 |
| 6,720,627 B1* | 4/2004 | Iwata | H01L 21/26506 257/351 |
| 6,815,298 B2* | 11/2004 | Tsuchiaki | H01L 21/28061 257/E21.165 |
| 6,838,363 B2* | 1/2005 | Wieczorek | H01L 21/26506 257/E21.165 |
| 2002/0022366 A1* | 2/2002 | Cabral, Jr. | H01L 21/28518 438/682 |
| 2002/0074612 A1* | 6/2002 | Bulucea | H01L 21/26586 257/402 |
| 2004/0245583 A1* | 12/2004 | Horiuchi | H01L 21/26513 257/408 |
| 2004/0256645 A1* | 12/2004 | Tsuchiaki | H01L 21/28518 257/288 |
| 2005/0116360 A1* | 6/2005 | Huang | H01L 21/823807 257/213 |
| 2006/0086975 A1 | 4/2006 | Liaw | |
| 2006/0124969 A1* | 6/2006 | Byun | H01L 29/1083 257/216 |
| 2008/0001224 A1* | 1/2008 | Kinoshita | H01L 29/6653 257/346 |
| 2008/0061379 A1* | 3/2008 | Chen | H01L 29/6656 257/382 |
| 2008/0090369 A1* | 4/2008 | Akiyama | H01L 21/28518 438/308 |
| 2009/0250733 A1* | 10/2009 | Adkisson | H01L 27/14603 257/292 |
| 2009/0321824 A1* | 12/2009 | Shima | H01L 29/0847 257/336 |
| 2010/0155841 A1* | 6/2010 | Kim | H01L 29/7835 257/346 |
| 2011/0027955 A1 | 2/2011 | Woon et al. | |
| 2011/0121400 A1* | 5/2011 | Larrieu | H01L 21/2257 257/369 |
| 2012/0199896 A1* | 8/2012 | Noguchi | H01L 27/11524 257/296 |
| 2013/0023102 A1* | 1/2013 | Aoyama | H01L 21/823418 438/301 |
| 2013/0126893 A1* | 5/2013 | Tanaka | H01L 29/2003 257/76 |
| 2013/0292781 A1 | 11/2013 | Chen et al. | |
| 2014/0264588 A1 | 9/2014 | Chen et al. | |
| 2015/0255475 A1* | 9/2015 | Tomino | H01L 29/7838 257/314 |
| 2015/0372142 A1* | 12/2015 | Kuang | H01L 29/7848 257/192 |
| 2016/0043188 A1* | 2/2016 | Chu | H01L 27/124 257/72 |

\* cited by examiner

POWER MOSFETS AND METHODS FOR MANUFACTURING THE SAME

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

ICs may contain transistor devices that have doped regions. As transistor sizes continue to shrink, it is more difficult to prevent undesirable out-diffusion of the doped regions. Such out-diffusion may interfere with transistor device operation and/or degrade transistor performance. In addition, the shrinking transistor sizes may lead to problems such as current crowding, high source/drain resistance, and non-optimal doping profile.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"— when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
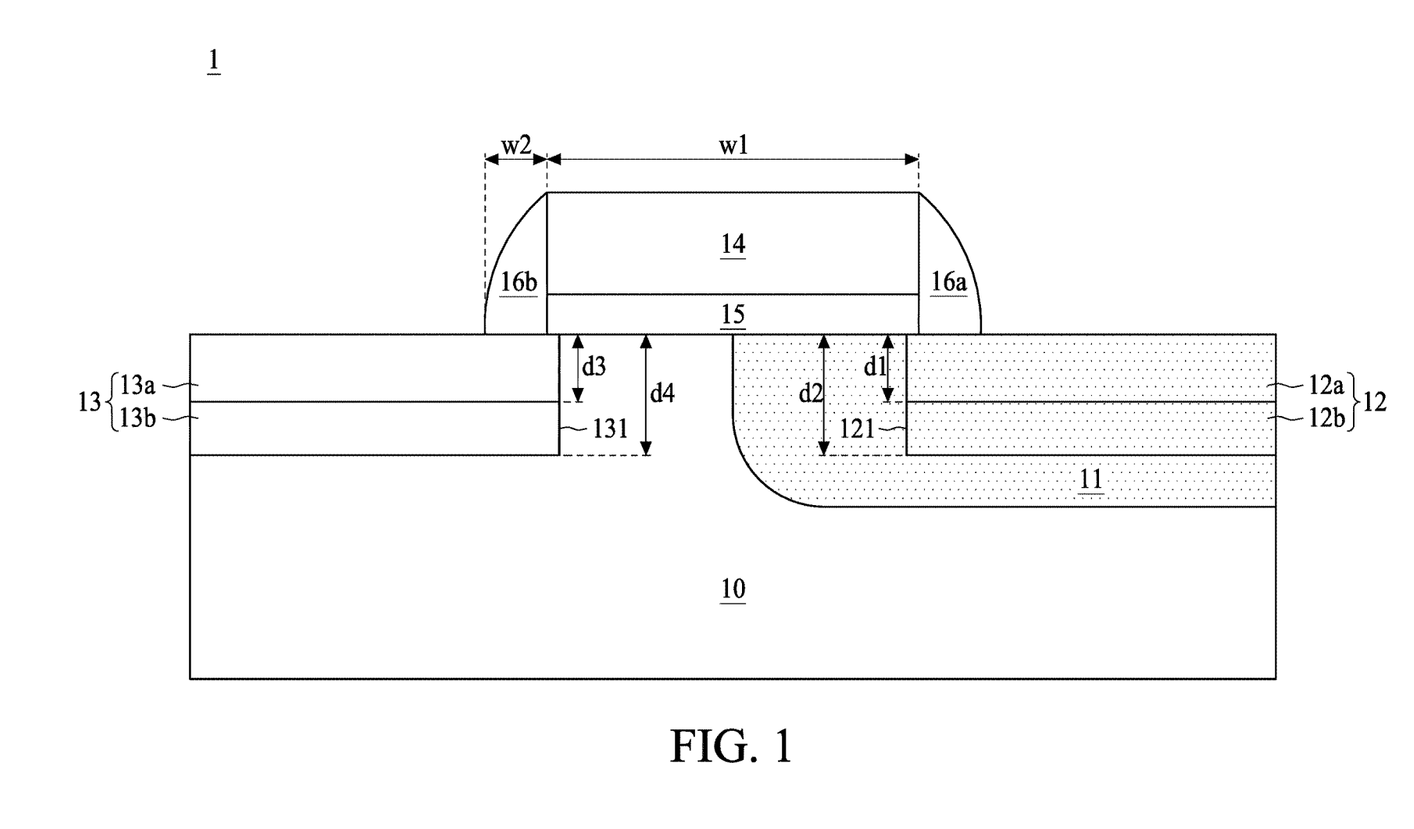
FIG. 1 is a schematic diagram of a MOSFET, in accordance with some embodiments.

FIG. 1 is a metal-oxide-semiconductor field-effect transistor (MOSFET) 1 in accordance with one embodiment of the present disclosure. The MOSFET includes a substrate 10, a lightly doped region 11, a drain region 12, a source region 13, a gate electrode 14 and a dielectric layer 15.

The substrate 10 may be a p type doped substrate, or an n type doped substrate, which means that the semiconductor substrate 10 may be doped with either n type or p type impurities. The substrate 10 is formed from silicon, gallium arsenide, silicon germanium, silicon carbon, or other known semiconductor materials used in semiconductor device processing. Although a semiconductor substrate is used in the illustrated examples presented herein, in other alternative embodiments, epitaxially grown semiconductor materials or silicon on insulator (SOI) layers may be used as the substrate 10. In other embodiments, the substrate 10 may be a well region.

It is known in the art that dopant impurities can be implanted into a semiconductor material to form a p type or an n type material. A p type material may be further classified as p++, p+, p, p−, p−−, type materials, depending on the concentration of the dopant. If a material is stated to be a p type material, it is doped with p type impurities and it may be any of the p++, p+, p, p−, p−−, type materials. Similarly, an n type material may be further classified as n++, n+, n, n−, n−− type materials. If a material is stated to be an n type material, it is doped with n type impurities and it may be any of the n++, n+, n, n−, n−− type materials.

Dopant atoms for p type materials include boron, for example. In n type materials, dopant atoms include phosphorous, arsenic, and antimony, for example. Doping may be done through ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allows for in-situ doping during the epitaxial processes. It is common knowledge that implantation can be done through certain materials, such as thin oxide layers.

The doping concentration amounts for the well region and the diffusions described may vary with the process used and the particular design. Doping concentrations at a p type material or an n type material may range from $10^{14}$ atoms/$cm^3$ to $10^{22}$ atoms/$cm^3$, with a p+/n+ material with concentrations being greater than about $10^{18}$/$cm^3$, for example. Some other ranges of concentrations may be used, such as an n--/p-- material with a doping concentration less than $10^{14}$ atoms/$cm^3$, an n-/p- material with a doping concentration ranging from $10^{14}$ atoms/$cm^3$ to $10^{16}$ atoms/$cm^3$, an n/p material with a doping concentration ranging from $10^{16}$ atoms/$cm^3$ to $10^{18}$ atoms/$cm^3$, an n+/p+ material with a doping concentration ranging from $10^{18}$ atoms/$cm^3$ to $10^{20}$ atoms/$cm^3$, and an n++/p++ material with a doping concentration ranging larger than $10^{20}$ atoms/$cm^3$. Further alternative ranges of concentrations may be used, such as an n--/p-- material with a doping concentration range around $10^{15}$ to $10^{18}$ atoms/$cm^3$, and an n-/p- material with a doping concentration 5 to 100 times heavier than the concentration of an n--/p-- material.

The lightly doped region 11 of a first conductivity type is formed at one side in the substrate 10. The lightly doped region 11 may be formed by performing an ion implantation process known in the art. In some embodiments, the MOSFET shown in FIG. 1 is an NMOS device, therefore N-type dopants such as phosphorus with energy ranging from about 80 KeV to about 90 KeV may be used to form the lightly doped region 11. In other embodiments, for a PMOS device (not illustrated), P-type dopants such as boron may be used to form the lightly doped region 11.

The drain region 12 of the first conductivity type is within the lightly doped region 11. The drain region 12 may have a drain contact (not shown in the drawing). The drain region 12 comprises a first drain region 12a and a second drain region 12b. Both of the first drain region 12a and the second drain region 12b are within the lightly doped region 11. The first drain region has a junction depth d1 measured from a top surface of the substrate 10. The second drain region 12b has a junction depth d2 measured from the top surface of the substrate 10. The junction depth d2 is greater than the junction depth d1. In some embodiments, the junction depth d1 is in a range from about 0.01 µm to about 0.022 µm and the junction depth d2 is in a range from about 0.02 µm to about 0.054 µm. In some embodiments, the first drain region 12a and the second drain region 12b are formed of different materials. For example, the first drain region 12a can be formed of arsenic with energy in a range from about 10 KeV to about 30 KeV and the second drain region 12b can be formed of phosphorous with energy in a range from about 20 KeV to about 40 KeV.

The source region 13 of the first conductivity type is at another side within the substrate 10. The source region 13 may have a drain contact (not shown in the drawing). The source region 13 comprises a first source region 13a and a second source region 13b. The first source region 13a has a junction depth d3 measured from the top surface of the substrate 10. The second source region 13b has a junction depth d4 measured from the top surface of the substrate 10. The junction depth d4 is greater than the junction depth d3. In some embodiments, the junction depth d3 is in a range from about 0.01 µm to about 0.022 µm and the junction depth d4 is in a range from about 0.02 µm to about 0.054 µm. In some embodiments, the first source region 13a and the second source region 13b are formed of different materials. For example, the first source region 13a can be formed of arsenic with energy in a range from about 10 KeV to about 30 KeV and the second source region 13b can be formed of phosphorous with energy in a range from about 20 KeV to about 40 KeV.

The surface 121 of the drain region 12 and the surface 131 of the source region 13 define a channel therebetween. The surface 131 of the source region 13 directly contacts the well region 10. In some embodiments, all surfaces of the source region 13 directly contact the well region 10. Therefore, the source region 13 is not surrounded by the lightly doped region.

The dielectric layer 15 is on the top surface of the substrate 10 and between the drain region 12 and the source region. The dielectric layer 15 covers a part of the lightly doped region 11, a part of the drain region 12 and a part of the source region 13. Therefore, the dielectric layer 15 overlaps with a part of the drain region 12 or a part of the source region. The overlap of the dielectric layer 15 and the drain region 12 or the source region 13 is about 0.3 µm. The dielectric layer 15 may include silicon oxide, silicon nitride, silicon oxynitride, a high-k dielectric material, combinations thereof, or multi-layers thereof. The high-k dielectric material may comprise $TiO_2$, $HfZrO$, $Ta_2O_3$, $HfSiO_4$, $ZrO_2$, $ZrSiO_2$, combinations thereof, or other suitable material. The dielectric layer 15 may have a thickness between about 100 Å and about 2,500 Å, although different thicknesses may be used.

The gate electrode 14 is on the dielectric layer 15. The gate electrode 14 fully covers the dielectric layer 15, and thus the gate electrode 14 overlaps with a part of the drain region 12 or a part of the source region 13. The gate electrode 14 may include a conductive material such as doped polysilicon, a metal, a metal alloy, or the like. A silicide layer (not shown in the drawing) may be formed on the gate electrode by a self-aligned silicide process.

The spacers 16a, 16b are on the substrate 10. The spacer 16a is at one side of the gate electrode 14 and in contact with a coplanar surface defined by lateral surfaces of the gate electrode 14 and the dielectric layer 15. The spacer 16b is at an opposing side of the gate electrode 14 and in contact with a coplanar surface defined by lateral surfaces of the gate electrode 14 and the dielectric layer 15. The spacers 16a, 16b are made of a dielectric material, such as silicon oxide, silicon oxynitride (SiON), or silicon nitride (SiN). In some embodiments, a ratio of the width W1 of the gate electrode 14 to the width W2 of the spacer 16a or 16b is in a range from about 4:1 to about 7:1.

In some embodiments, the lightly doped region would be implanted at both side (i.e., the drain side or the source side) of the substrate to prevent the MOSFET from offset gate issue. However, the lightly doped regions of the source side and the drain side might be physically contacted to each other to form an undesired short circuit in the channel of the MOSFET, if the width of the gate electrode is insufficient. To prevent the lightly doped regions from contacting to each other, the gate electrode with a wider width should be used.

One of the benefits of the present disclosure is to provide an asymmetric lightly doped profile such that a smaller gate electrode width can be implemented and therefore shrinking the size of the transistor.

In accordance with the embodiments shown in FIG. 1 of the present disclosure, the gate electrode 14 partially overlaps with the drain region 12 or the source region 13 to prevent the MOSFET 1 from offset gate issue. Therefore, it is unnecessary to implant the lightly doped regions at both of the drain side and the source side. As shown in FIG. 1, the lightly doped region 11 is implanted at only the drain side. Therefore, in comparison with the MOSFET with the lightly doped regions at both of the drain side and the source side, the MOSFET 1 shown in FIG. 1 has narrower width of the gate electrode 14. The channel length of a MOSFET is defined by the width of the gate electrode 14, and thus reducing the width of the gate electrode 14 would reduce the channel length of the MOSFET. In some embodiments, the channel of the MOSFET 1 is about 58% to 66% less than that of the conventional MOSFET (for an NMOS), and the channel of the MOSFET 1 is about 60% to 70% less than that of the conventional MOSFET (for a PMOS). Reducing the channel length of a MOSFET would reduce the turn on resistance (Ron) and the gate charge, which would in turn increase the performance of the MOSFET.

FIGS. 2A-2E illustrate, in cross-sectional views, a method of manufacturing a MOSFET, in accordance with some embodiments. The resulting MOSFET may be the MOSFET 1 shown in FIG. 1. Alternative methods may be used to make the MOSFET 1 shown in FIG. 1 or alternative embodiments of the MOSFET.

Figure 2A:
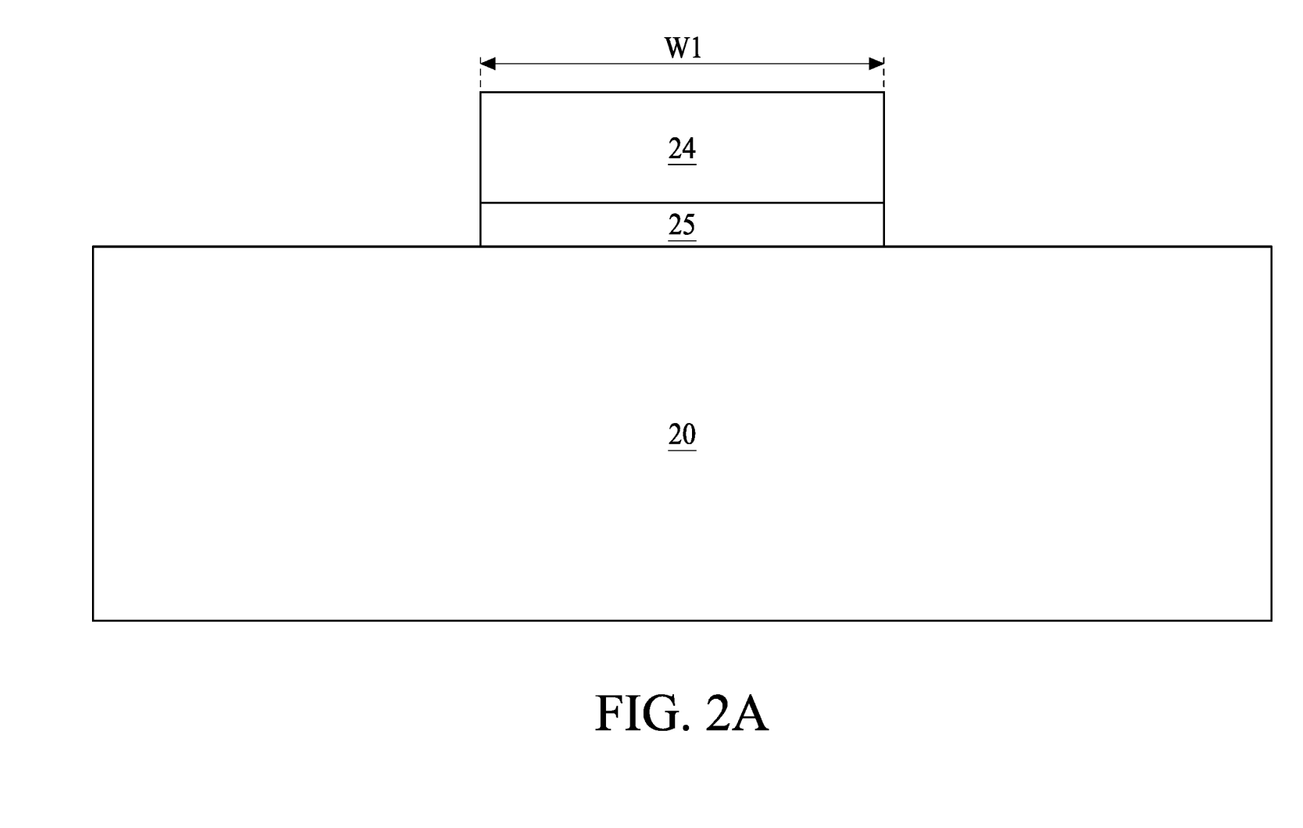
FIGS. 2A-2E illustrate a process of manufacturing a MOSFET, in accordance with some embodiments.

As illustrated in FIG. 2A, a substrate 20 is provided. An optional n+ Buried Layer (NBL) may be formed in a portion of the substrate 20, (not shown in the drawing). In other embodiments, the subject 20 may be a well region. The substrate 20 may be a p type doped substrate, or an n type doped substrate, which means that the semiconductor substrate 20 may be doped with either n type or p type impurities. The substrate 20 is formed from silicon, gallium arsenide, silicon germanium, silicon carbon, or other known semiconductor materials used in semiconductor device processing. Although a semiconductor substrate is used in the illustrated examples presented herein, in other alternative embodiments, epitaxially grown semiconductor materials or silicon on insulator (SOI) layers may be used as the substrate 20.

It is known in the art that dopant impurities can be implanted into a semiconductor material to form a p type or an n type material. A p type material may be further classified as p++, p+, p, p-, p--, type materials, depending on the concentration of the dopant. If a material is stated to be a p type material, it is doped with p type impurities and it may be any of the p++, p+, p, p-, p--, type materials. Similarly, an n type material may be further classified as n++, n+, n, n-, n-- type materials. If a material is stated to be an n type material, it is doped with n type impurities and it may be any of the n++, n+, n, n-, n-- type materials. Dopant atoms for p type materials include boron, for example. In n type materials, dopant atoms include phosphorous, arsenic, and antimony, for example. Doping may be done through ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allows for in-situ doping during the epitaxial processes. It is common knowledge that implantation can be done through certain materials, such as thin oxide layers.

The doping concentration amounts for the well region and the diffusions described may vary with the process used and the particular design. Doping concentrations at a p type material or an n type material may range from $10^{14}$ atoms/cm$^3$ to $10^{22}$ atoms/cm$^3$, with a p+/n+ material with concentrations being greater than about $10^{18}$/cm$^3$, for example. Some other ranges of concentrations may be used, such as an n--/p-- material with a doping concentration less than $10^{14}$ atoms/cm$^3$, an n-/p- material with a doping concentration ranging from $10^{14}$ atoms/cm$^3$ to $10^{16}$ atoms/cm$^3$, an n/p material with a doping concentration ranging from $10^{16}$ atoms/cm$^3$ to $10^{18}$ atoms/cm$^3$, an n+/p+ material with a doping concentration ranging from $10^{18}$ atoms/cm$^3$ to $10^{20}$ atoms/cm$^3$, and an n++/p++ material with a doping concentration ranging larger than $10^{20}$ atoms/cm$^3$. Further alternative ranges of concentrations may be used, such as an n--/p-- material with a doping concentration range around $10^{15}$ to $10^{18}$ atoms/cm$^3$, and an n-/p- material with a doping concentration 5 to 100 times heavier than the concentration of an n--/p-- material.

A dielectric layer 25 is formed on the top surface of the substrate 20. The dielectric layer 25 may include silicon oxide, silicon nitride, silicon oxynitride, a high-k dielectric material, combinations thereof, or multi-layers thereof. The high-k dielectric material may comprise $TiO_2$, $HfZrO$, $Ta_2O_3$, $HfSiO_4$, $ZrO_2$, $ZrSiO_2$, combinations thereof, or other suitable material. The dielectric layer 25 may be formed by atomic layer deposition (ALD) and/or other suitable methods. The dielectric layer 25 may have a thickness between about 100 Å and about 2,500 Å, although different thicknesses may be used.

The gate electrode 24 is formed on the dielectric layer 25 and fully covers the dielectric layer 25. The gate electrode 24 may include a conductive material such as doped polysilicon, a metal, a metal alloy, or the like. A silicide layer (not shown in the drawing) may be formed on the gate electrode by a self-aligned silicide process. In accordance with some embodiments, for an NMOS, the width W1 of the gate electrode is in a range from about 0.35 μm to about 0.4 μm; and for a PMOS, the width W1 of the gate electrode is in a range from about 0.3 μm to about 0.35 μm. However, the width of the gate electrode would vary based on the manufacturing process.

Figure 2B:
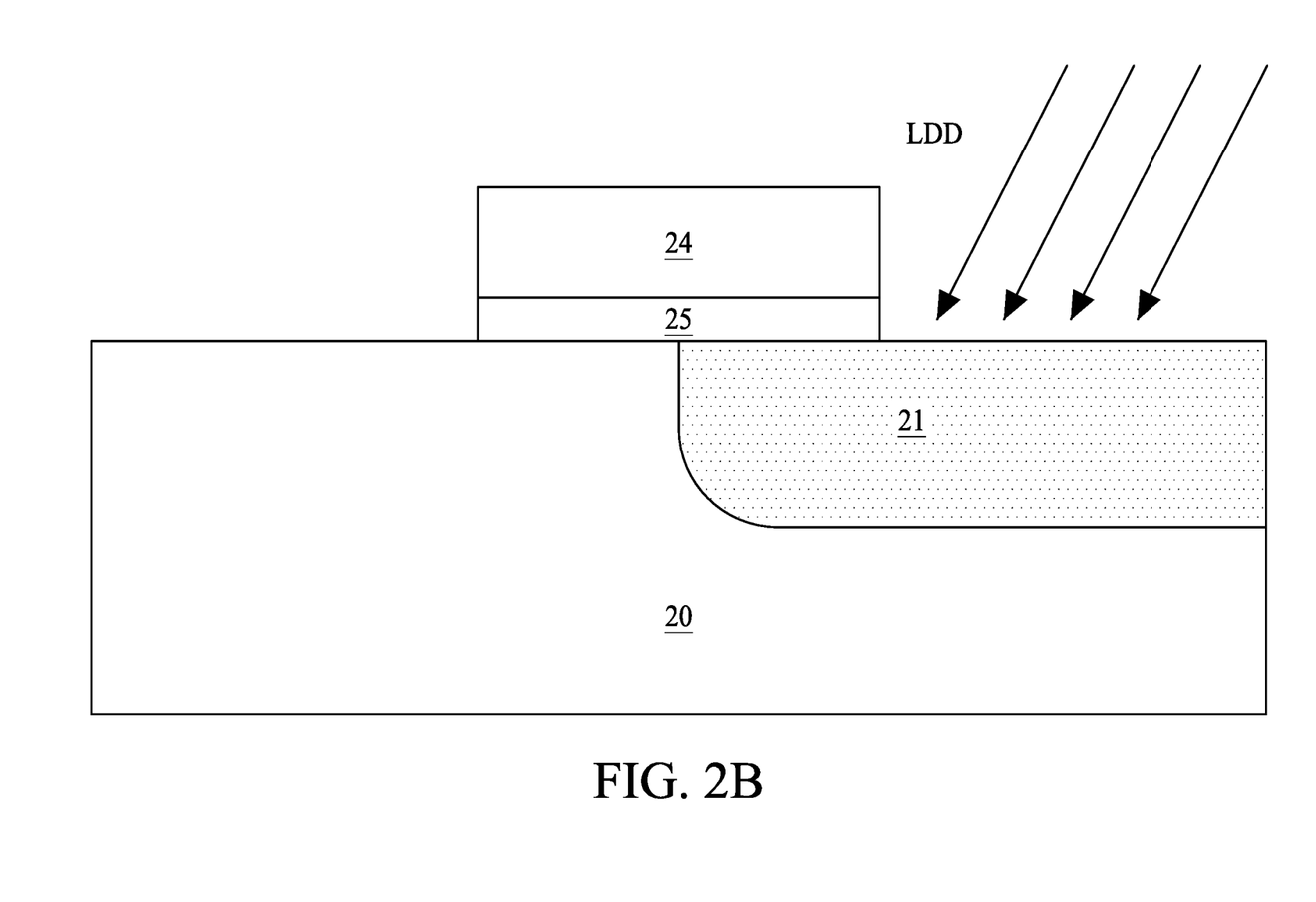

Referring to FIG. 2B, a lightly doped region 21 is formed at one side within the substrate 20. In some embodiments, the lightly doped region 21 is formed at one side within a well region of the substrate 20. The lightly doped region 21 may be formed by performing an ion implantation process with a tilting angle of from about 30 to about 45 degrees known in the art. In some embodiments, the MOSFET shown in FIG. 2B is an NMOS device, therefore N-type dopants such as phosphorus with energy ranging from about 80 KeV to about 90 KeV may be used to form the lightly doped region 21. In other embodiments, for a PMOS device (not illustrated), P-type dopants such as boron may be used to form the lightly doped region 21.

Figure 2C:
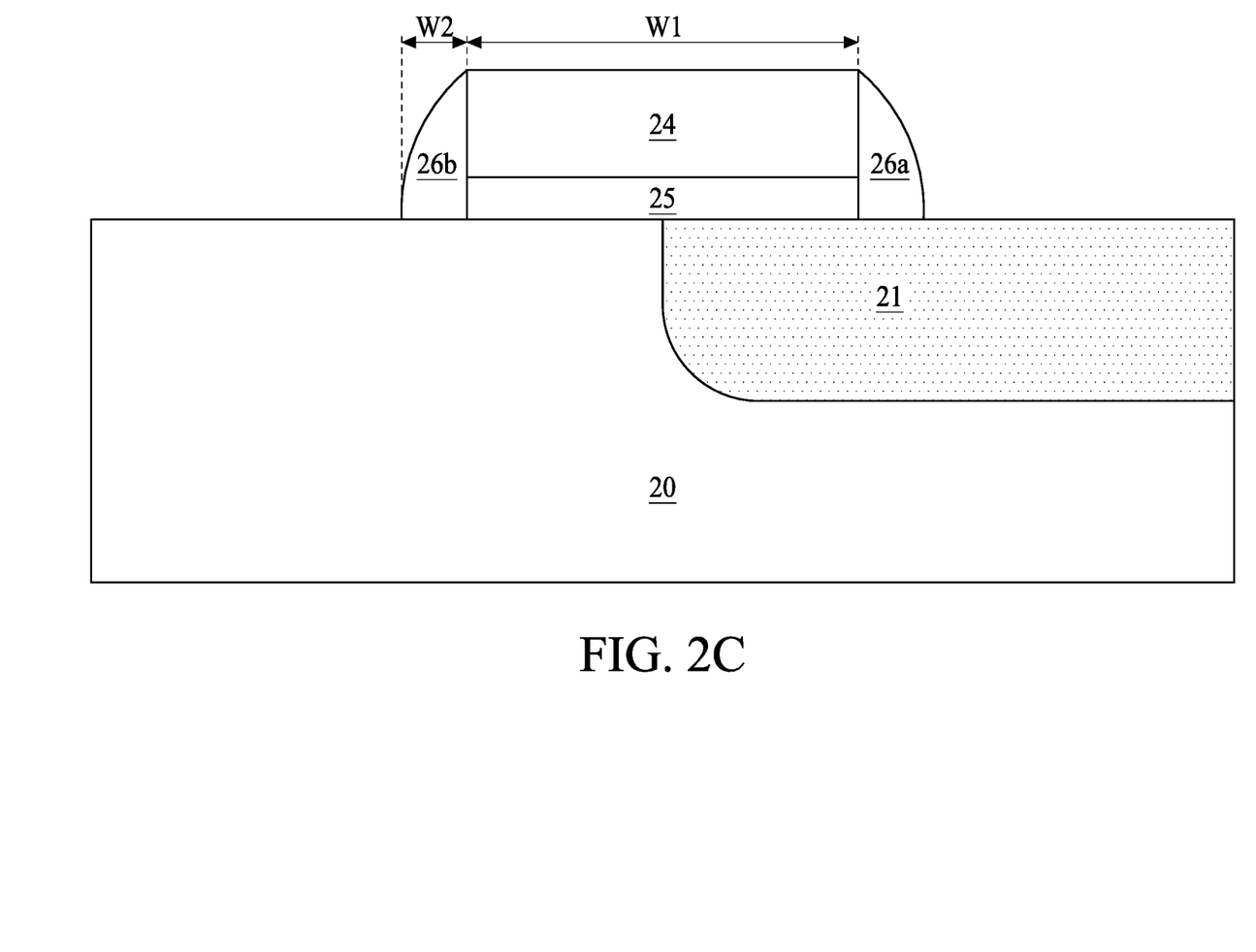

Referring to FIG. 2C, the spacers 26a, 26b are formed on the substrate 20. The spacer 26a is formed at one side of the gate electrode 24 and in contact with a coplanar surface defined by lateral surfaces of the gate electrode 24 and the dielectric layer 25. The spacer 26b is at an opposing side of the gate electrode 24 and in contact with a coplanar surface defined by lateral surfaces of the gate electrode 24 and the dielectric layer 25. The spacers 26a, 26b are made of a dielectric material, such as silicon oxide, silicon oxynitride (SiON), or silicon nitride (SiN). In some embodiments, the spacers 26a, 26b are formed by deposition process such as a plasma-enhanced chemical vapor deposition (PECVD) process. Other applicable deposition processes may also be used. In some embodiments, a ratio of the width W1 of the gate electrode 24 to the width W2 of the spacer 26a or 26b is in a range from about 4:1 to about 7:1.

Figure 2D:
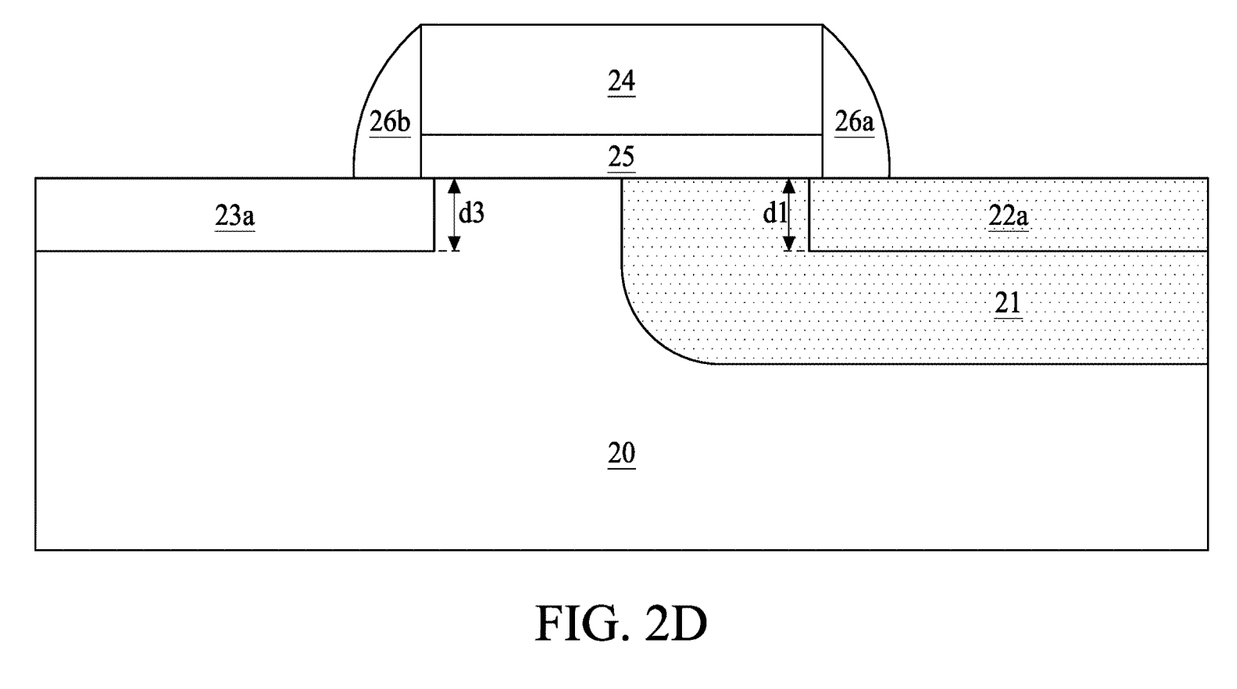

Referring to FIG. 2D, the first drain region 22a is formed within the lightly doped region 21 by an ion implantation operation. In some embodiments, the ion implantation for the first drain region 22a is performed with no tilting angle. The conductivity type of the first drain region is the same as that of the lightly doped region 21. The first drain region 22a has a junction depth d1 measured from a top surface of the substrate 20. In some embodiments, the junction depth d1 is in a range from about 0.01 μm to about 0.022 μm. In some embodiments, the first drain region 22a may include arsenic with energy in a range from about 10 KeV to about 30 KeV. During implanting the first drain region 22a, dopants of the first drain region 22a diffuse laterally into the region of the substrate 20 under the spacer 26a and the dielectric layer 25. Therefore, the dielectric layer 25 overlaps with a part of the first drain region 22a. The overlap of the dielectric layer 25 and the first drain region 22a is about 0.3 μm.

The first source region 23a is formed within the substrate 20 by implanting ions. The conductivity type of the first source region 23a is the same as that of the first drain region 22a. The first source region 23a has a junction depth d3 measured from a top surface of the substrate 20. In some embodiments, the junction depth d3 is in a range from about 0.01 μm to about 0.022 μm. In some embodiments, the first source region 23a may include arsenic with energy in a range from about 10 KeV to about 30 KeV. During implanting the first source region 23a, dopants of the first source region 23a diffuse laterally into the region of the substrate 20 under the spacer 26b and the dielectric layer 25. Therefore, the dielectric layer 25 overlaps with a part of the first source region 23a. The overlap of the dielectric layer 25 and the first source region 23a is about 0.3 μm.

Figure 2E:
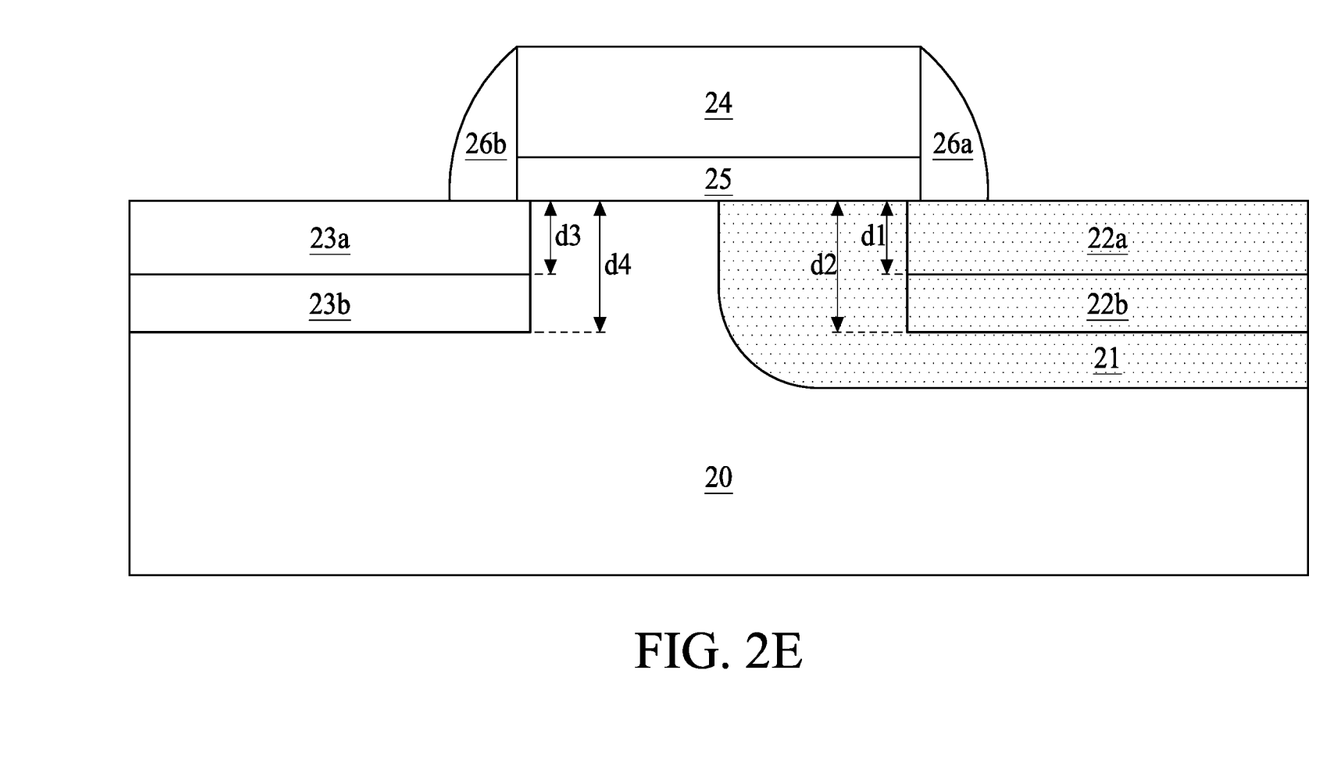

Referring to FIG. 2E, the second drain region 22b is formed within the lightly doped region 21 by another ion implantation operation. The conductivity type of the second drain region 22b is the same as that of the first drain region 22a. The second drain region 22b has a junction depth d2 measured from a top surface of the substrate 20. The junction depth d2 is larger than the junction depth d1. In some embodiments, the junction depth d2 is in a range from about 0.02 μm to about 0.054 μm. In some embodiments, the dopant in the second drain region 22b is different from that in the first drain region 22a. The second drain region 22b may include phosphorous implanted with energy in a range from about 20 KeV to about 40 KeV. During implanting the second drain region 22b, dopants of the second drain region 22b diffuse laterally into the region of the substrate 20 under the spacer 26a and the dielectric layer 25. Therefore, the dielectric layer 25 overlaps with a part of the second drain region 22b. The overlap of the dielectric layer 25 and the second drain region 22b is about 0.3 μm.

The second source region 23b is formed within the substrate 20 by implanting ions. The conductivity type of the second source region 23b is the same as that of the first source region 23a. The second source region 23b has a junction depth d4 measured from a top surface of the substrate 20. The junction depth d4 is larger than the junction depth d3. In some embodiments, the junction depth d4 is in a range from about 0.02 μm to about 0.054 μm. In some embodiments, the dopant in the second source region 23b is different from that in the first source region 23a. The second source region 23b may include phosphorous implanted with energy in a range from about 20 KeV to about 40 KeV. During implanting the second source region 23b, dopants of the second source region 23b diffuse laterally into the region of the substrate 20 under spacer 26b and the dielectric layer 25. Therefore, the dielectric layer 25 overlaps with a part of the second source region 23b. The overlap of the dielectric layer 25 and the second source region 23b is about 0.3 μm. A rapid thermal annealing (RTA) operation can be employed to foster the lateral diffusion. In some embodiments, the RTA is performed to anneal the first drain region 22a, the second drain region 22b, the first source region 23a and the second source region 23b. In some embodiments, the RTA process is performed for about 1010~1020 degrees Celsius and 10 seconds to facilitate the lateral diffusion of the dopants especially in the first source region 23a and the second source region 23b.

As mentioned above, in some embodiments, in order to avoid the offset gate issue, the lightly doped region would be implanted at both side (i.e., the drain side or the source side) of the substrate, resulting in the increased width of the gate electrode. To resolve this problem, some embodiments would replace the lightly doped region at the source side by a core lightly doped region (i.e., the lightly doped region plus a pocket implant at a core region, as opposed to an I/O region). However, this additional pocket implant is designed for mitigating device punch-through but would generate a higher threshold voltage due to the heavily doped nature. The present disclosure provides an asymmetric lightly doped structure with only one side of the well region possessing a lightly doped region, according to some embodiments. The offset gate issue can be circumvented by employing a suitable RTA and a suitable gate spacer width such that dopants in the source or drain whichever without lightly doped region can be properly diffused toward the region under gate electrode and reside beneath the gate oxide.

In accordance with the embodiments shown in FIGS. 2A-2E of the present disclosure, since the width of the spacers 26a, 26b and the condition (i.e., the energy, concentration, species and doping depth) for implanting the first drain region 22a, the second drain region 22b, the first source region 23a, the second source region 23b are optimized, it is ensured that the dopants from both of the source region and the drain region would diffuse under the gate electrode to prevent the MOSFET from offset gate issue. Therefore, it is unnecessary to form the lightly doped regions at both of the drain side and the source side. Therefore, in comparison with the MOSFET with the lightly doped regions at both of the drain side and the source side, the MOSFET shown in FIG. 2E has narrower width of the gate electrode 24. The channel length of a MOSFET is defined by the width of the gate electrode 24, and thus reducing the width of the gate electrode 24 would reduce the channel length of the MOSFET. In some embodiments, the channel of the MOSFET is about 58% to 66% less than that of the conventional MOSFET (for an NMOS), and the channel of the MOSFET is about 60% to 70% less than that of the conventional MOSFET (for a PMOS). Reducing the channel length of a MOSFET would reduce the turn on resistance (Ron) and the gate charge, which would in turn increase the performance of the MOSFET.

The process shown in FIGS. 2A-2E is merely illustrative and is m not limiting. There may be other variations of the process steps, and the process steps may be performed in different sequences. Other process steps may follow after the process shown in FIGS. 2A-2E.

In view of the above, in some embodiments, a MOSFET with lower turn on resistance is provided by reducing the channel length of a MOSFET, which would in turn to increase the performance of the MOSFET.

In accordance with an embodiment, a semiconductor device comprises a well region, a first doped region, a drain region, a source region and a gate electrode. The first doped region of a first conductivity type is located at a first side within the well region. The drain region of the first conductivity type is within the first doped region. The source region of the first conductivity type is at a second side within the well region, wherein the second side being opposite to the first side. The gate electrode is over the well region and between the source region and the drain region. A surface of the drain region and a surface of the source region define a channel and the surface of the source region directly contacts the well region.

In accordance with another embodiment, a semiconductor device comprises a well region, a lightly doped region, a drain region, a source region, a gate electrode and spacers. The lightly doped region of a first conductivity type is located at a first side within the well region. The drain region of the first conductivity type is within the lightly doped region. The source region of the first conductivity type is at a second side within the well region, wherein the second side being opposite to the first side. The gate electrode is over the well region and between the source region and the drain region. The spacers are located at both sides of the gate electrode. A ratio of the width of each spacer to the width of the gate electrode is in a range from about 1:4 to about 1:7.

In accordance with another embodiment, a method of manufacturing a semiconductor device comprises forming a well region, implanting a lightly doped region in a first side of the well region, implanting a first drain region in the lightly doped region by a first depth, implanting a second drain region in the lightly doped region by a second depth, implanting a source region in a second side of the well region, the second side being opposite to the first side, and forming a gate electrode over the well region. The second depth is greater than the first depth.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:

1. A semiconductor structure, comprising:
a well;
a first doped region of a first conductivity type located at a first side within the well, the first doped region comprising a first dopant concentration greater than a dopant concentration of the well;
a drain of the first conductivity type within the first doped region, the drain comprising a second dopant concentration greater than the first dopant concentration;
a source of the first conductivity type at a second side within the well, the second side being opposite to the first side, the source comprising a third dopant concentration greater than the first dopant concentration, the source comprising:
a first source region having a substantially vertical boundary facing the drain, the substantially vertical boundary of the first source region directly interfacing with the well; and
a second source region under the first source region, having a substantially vertical boundary facing the drain, the substantially vertical boundary of the second source region directly interfacing with the well, the first source region having a dopant different from a dopant of the second source region; and
a gate electrode over the well and between the source and the drain, the gate electrode covering a part of the first doped region and a part of the drain.

2. The semiconductor structure of claim 1, wherein the drain has a first drain region and a second drain region, and the depth of the first drain region is different from that of the second drain region.

3. The semiconductor structure of claim 2, wherein the source has a first source region and a second source region, and the depth of the first source region is different from that of the second source region.

4. The semiconductor structure of claim 3, wherein the first drain region and the second drain region are formed of different dopants.

5. The semiconductor structure device of claim 3, wherein the first drain region or the first source region comprises arsenic.

6. The semiconductor structure of claim 3, wherein the second drain region or the second source region comprises phosphorous.

7. The semiconductor structure of claim 3, wherein the depth of the first drain region or the depth of the first source region is in a range from 0.01 µm to 0.022 µm.

8. The semiconductor structure of claim 3, wherein the depth of the second drain region or the depth of the second source region is in a range from about 0.02 µm to about 0.054 µm.

9. The semiconductor structure of claim 1, further comprising spacers located at both sides of the gate electrode, wherein a ratio of the width of each spacer to the width of the gate electrode is in a range of 1:4 to 1:7.

10. The semiconductor structure of claim 1, wherein the drain extends beneath the gate electrode in a distance of 0.3 µm.

11. A high voltage MOSFET, comprising:
a well;
a lightly doped region of a first conductivity type located at a first side within the well;
a drain of the first conductivity type within the lightly doped region;
a source of the first conductivity type at a second side within the well, the second side being opposite to the first side, the source comprising:
a first source region having a first boundary facing the drain, the first boundary directly interfacing with the well; and
a second source region under the first source region, having a second boundary facing the drain, the second boundary directly interfacing with the well, the first source region having a dopant different from a dopant of the second source region, and the first boundary and the second boundary being vertically aligned;

a gate electrode over the well and between the source and the drain, the gate electrode covering a part of the lightly doped region and a part of the drain; and spacers located at both sides of the gate electrode, wherein a ratio of the width of each spacer to the width of the gate electrode is in a range from 1:4 to 1:7.

12. The high voltage MOSFET of claim 11, wherein the drain has a first drain region and a second drain region formed of different dopants.

13. The high voltage MOSFET of claim 12, wherein the depth of the first drain region or the depth of the first source region is in a range from about 0.01 µm to about 0.022 µm, and the depth of the second drain region or the depth of the second source region is in a range from 0.02 µm to 0.054 µm.

14. The high voltage MOSFET of claim 12, wherein the drain extends beneath the gate electrode in a distance of 0.3 µm.

15. A high voltage semiconductor structure, comprising:
a well of a first conductivity type;
a lightly doped region of a second conductivity type located at a first side within the well, the lightly doped region comprising a first dopant concentration greater than a dopant concentration of the well;
a drain of the second conductivity type within the lightly doped region, the drain comprising a second dopant concentration greater than the first dopant concentration;
a source of the second conductivity type at a second side within the well region, the second side being opposite to the first side, the source comprising a third dopant concentration greater than the first dopant concentration, the source comprising:
a first source region having a substantially vertical boundary facing the drain, the substantially vertical boundary of the first source region directly interfacing with the well; and
a second source region under the first source region, having a substantially vertical boundary facing the drain, the substantially vertical boundary of the second source region directly interfacing with the well, the first source region having a dopant different from a dopant of the second source region; and
a gate electrode over the well and between the source and the drain, the gate electrode covering a part of the lightly doped region and a part of the drain.

16. The high voltage semiconductor structure of claim 15, wherein a bottom boundary of the source directly contacts the well.

17. The high voltage semiconductor structure of claim 15, wherein the source extends beneath the gate electrode.

18. The high voltage semiconductor structure of claim 15, further comprising spacers located at both sides of the gate electrode, wherein a ratio of a width of each spacer to a width of the gate electrode is in a range of from 1:4 to 1:7.

19. The high voltage semiconductor structure of claim 15, wherein a dopant concentration in proximity to the substantially vertical boundary of the first source region is less than a dopant concentration of the drain in proximity to the boundary of the drain and the lightly doped region.

20. The high voltage semiconductor structure of claim 15, wherein the drain extends beneath the gate electrode in a distance of 0.3 µm.

* * * * *